United States Patent [19]

Ulrich et al.

[11] Patent Number: 4,922,078
[45] Date of Patent: May 1, 1990

[54] PROCESS FOR OPERATING AN EXPOSURE APPARATUS AND EXPOSURE APPARATUS FOR CONDUCTING THIS PROCESS

[75] Inventors: Peter Ulrich, Rodgau; Hans P. Weihe, Frankfurt am Main, both of Fed. Rep. of Germany

[73] Assignee: E. I. Du Pont de Nemours and Company, Wilmington, Del.

[21] Appl. No.: 235,400

[22] Filed: Aug. 24, 1988

[30] Foreign Application Priority Data

Oct. 14, 1987 [DE] Fed. Rep. of Germany ....... 3734767

[51] Int. Cl.⁵ ............................ F27D 7/04; H05B 3/20
[52] U.S. Cl. ...................................... 219/216; 219/400
[58] Field of Search ....................... 219/216, 220, 400; 313/15

[56] References Cited

U.S. PATENT DOCUMENTS 2,581,959  1/1952  Koehler ................................ 313/15
3,457,454  7/1969  Boland ................................. 313/15
3,779,640  12/1973 Kidd ..................................... 313/15
4,140,385  2/1979  Shaw .................................... 313/15

FOREIGN PATENT DOCUMENTS 1597665   9/1970  Fed. Rep. of Germany .
2527299  12/1976  Fed. Rep. of Germany .
3110512  10/1982  Fed. Rep. of Germany .
1352182   1/1964  France ......................... 313/15
15910     8/1956  German Democratic Rep. .
122549    2/1959  U.S.S.R. ...................... 313/15
1178190   1/1970  United Kingdom .

Primary Examiner—Teresa J. Walberg

[57] ABSTRACT

A process and apparatus for obtaining uniform light distribution in an exposure apparatus having at least one fluorescent light tube involves heating the light tube along most of its length to a temperature above ambient temperature prior to activating the exposure apparatus. A heater is disposed on the back of a transparent partition and a blower is provided for circulating hot air.

12 Claims, 1 Drawing Sheet

1

PROCESS FOR OPERATING AN EXPOSURE APPARATUS AND EXPOSURE APPARATUS FOR CONDUCTING THIS PROCESS

FIELD OF THE INVENTION

This invention relates to a process for obtaining uniform distribution of light and reproducible exposure in an apparatus for exposing a photopolymerizable material and to an exposure apparatus for conducting this process.

BACKGROUND OF THE INVENTION

Generally, the process of preparing a flexographic printing plate from a photopolymer element includes the steps of "backflash", main image exposure, development or "washout", drying detackification, and post exposure.

The "backflash" exposure may be used with elements having a transparent support. Backflash generally uses a radiation source emitting a principal wavelength around 360 nm. It serves to sensitize the plate and establishes the depth of the plate relief. The backflash exposure gives the photopolymer film a uniform and relatively short exposure through the support, thereby photocrosslinking binder and monomer in the floor region.

The primary purpose of the "backflash", the main imagewise exposure and overall post-exposing is to effect polymerization. Actinic radiation from a variety of sources can be used. These include commercial ultraviolet fluorescent tubes, medium, high, and low pressure mercury vapor lamps, argon glow lamps, electronic flash units, photographic flood lamps, pulsed xenon lamps, carbon arc lamps, etc. The radiation source must emit an effective amount of radiation having a wavelength in the range of 230 to 450 nm, preferably 300 to 420 nm and, more preferably, 340 to 400 nm. For efficient photopolymerization, the wavelength is matched to the absorption characteristic of the photoinitiator present in the photopolymerizable layer. Exposure times vary from a few seconds to a few minutes, depending upon the output of the lamps, distance from the lamps, relief depth desired, and the thickness of the plate.

It has been mentioned in DE-OS 31 10 512 that metal vapor arc lamps can be kept in a state of readiness by heating the small bulb to the temperature needed for the required operating vapor pressure before turning the lamp on. Maximum light output is achieved immediately when the lamp is turned on. There is no teaching of obtaining a uniform distribution of light in an exposure apparatus having at least one fluorescent light tube.

The Asahi Company's AFP 2500 is an apparatus used to expose the photopolymerizable layer. This apparatus contains several fluorescent lights positioned in a parallel fashion with respect to each other. The lights are located beneath a support made of a material which is transparent to the radiation. The fluorescent lights are low-pressure mercury lamps in which the internal luminescent layer converts the radiation from the mercury vapor column into UV and/or visible light One of the problems plaguing these commercial exposure apparatuses is that they are incapable of consistently providing a uniform distribution of light to large, e.g. 100 cm × 150 cm, photopolymerizable plates having increased photosensitivity and, thus, requiring a shorter exposure time.

SUMMARY OF THE INVENTION

A process for obtaining uniform light distribution in an exposure apparatus having at least one fluorescent light tube comprising heating the light tube along most of its length to a temperature above ambient temperature prior to activating the exposure apparatus. This invention also relates to an exposure apparatus designed for performing the process of the instant invention which comprises (a) a housing; (b) at least one fluorescent light tube contained within the housing; (c) a means for producing heat located within the housing; and (d) a means, located within the housing, for circulating the heat produced by the heating means.

DETAILED DESCRIPTION OF THE INVENTION

Uniform light distribution in an exposure apparatus having at least one fluorescent light tube is obtained by heating the light tube along most of its length to a temperature above ambient temperature prior to activating the exposure apparatus. The internal luminescent layer is warmed in such a way that there is no condensed or diffused mercury in one area. The term fluorescent light tube means any fluorescent light fixture, tube or bulb.

From the outset, the luminescent layer emits an approximately uniform radiation over its entire length. When the exposure apparatus is activated, a uniform distribution of light is obtained as well as full emission output.

The fluorescent light tubes should be warmed to a temperature between 35° C. and 45° C. and, preferably, about 40° C. Mercury condenses below 30° C. and/or diffuses into the luminescent layer. Above 45° C., the light yield declines.

Figure 1:
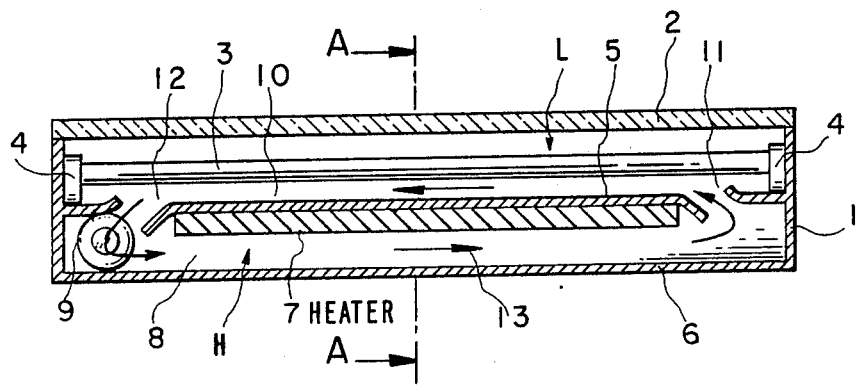
FIG. 1 shows a longitudinal cross section of an apparatus of the invention.
Figure 2:
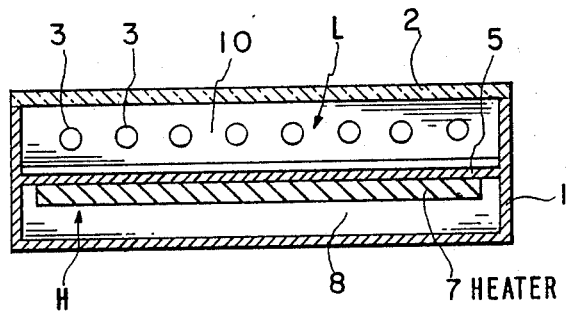
FIG. 2 shows a transverse cross section of the apparatus of the invention.

The apparatus of the present invention comprises, inter alia, a means for heating and a means for circulating heated air around the fluorescent light tube or tubes within the housing. FIG. 1 shows that an apparatus for exposing a photopolymerizable material comprises a housing (1), including a base, upright members, and a support (2). The support is made of a material which is capable of transmitting radiation without undue attenuation and the support is about 120 cm × 190 cm so that it is big enough to transmit light to the larger plates. Materials suitable for constructing the support include glass or plexiglas. A conventional fluorescent light tube or tubes are located at a very small distance beneath the support. The light tubes are positioned side by side and are retained in sockets (4). The term conventional means that the light tubes are the standard length, 176 cm, and provide the UV light needed to cure the photopolymer printing plates.

The means for producing heat located within said housing further comprises a heat transmitting partition (5) connected to the upright members and a heating membrane (7) positioned adjacent and underneath said partition (5). Any means for producing heat falls within the scope of this invention as long as it is a source of radiant heat. Thus, the source of heat can be electrical or it can have a tubing system to carry hot water or another carrier capable of radiating heat. The heat source, associated with the heating unit (H), radiates heat through the partition (5) so as to heat the fluorescent light tubes (3) over most of the their length to a temperature above ambient temperature.

A heating passage (8) is located beneath the heating member (7) wherein heat produced by the heat member is circulated by a suction blower (9). The suction blower can be, for example, a drum blower or a fan. An air passage (10) is located above the internal wall (5). This passage has an air inlet (11) situated near one end of the fluorescent light tubes (3), and an air outlet (12) situated near the opposite end of the light tube (3) to permit air to circulate around the fluorescent light tube or tubes. Thus, air is heated in the passage (8) and circulated by the means for circulating heat (9) through the air inlet (11) along most of the length of the fluorescent light tube (3) through the air outlet (12) to produce a circulating airflow (13). Taken together this forms the air conduit (L).

Figure 3:
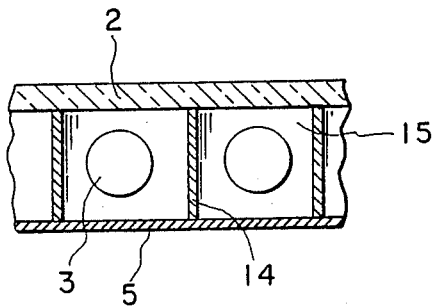
FIG. 3 shows an apparatus of the invention wherein the fluorescent tubes are separated by substantially longitudinal dividers.

FIG. 3 shows a modification of the apparatus of the invention where substantially longitudinal dividers (14) are used to to divide the airflow passage into individual sections (15). The dividers can reinforce the support (2) and can be made of the same material as the support (2). Suitable materials include glass, plexiglas, or a reflective material such as aluminum. It is important that the material be capable of transmitting radiation. The internal wall (5) can also have a reflecting surface.

The means for providing heat is operated at a thermal output capable of heating the fluorescent light tube or tubes (3) to a temperature of between 35° C. and 45° C. and, more preferably, between 35° C. and 40° C., prior to activating the exposure apparatus. Thus, the air circulated by means for circulating air (9), located within the housing, is maintained at a temperature capable of heating the fluorescent light tube or tubes to the appropriate temperature. When the apparatus is switched on, uniform radiation is obtained along the length of the fluorescent light tubes. Once the apparatus is activated the heating member (7) and the means for circulating the heat (9) can be switched off because some auto-heating is caused by the light tubes when they are in operation.

It is not necessary that the ends of the fluorescent light tubes be warmed above ambient temperature because the outer most edges of the support (2) are not utilized. It is believed that the ends of the fluorescent light tubes are heated by circulating heated air and by heat generated by the electrodes within the light tubes. From a practical standpoint, it is necessary that between 70 to 90% of the entire length of the fluorescent light tube be warmed above ambient temperature.

Uniform distribution of light and reproducible exposure are obtained with exposure times ranging anywhere from 3 seconds to 10 minutes.

It is understood that many variations of this invention are possible and all fall within the scope of this invention.

What is claimed is:

1. An apparatus for exposing a photopolymerizable material comprising:
    (a) a housing, said housing including a base, upright members, and a support member and for said photopolymerizable material, said support member capable of transmitting light without undue attenuation;
    (b) a plurality of fluorescent light tubes arranged in a parallel fashion within said housing and positioned adjacent said support member;
    (c) a means for producing heat located within said housing, said means for for producing heat comprising a heat transmitting partition connected to the upright members and a heating member positioned adjacent and underneath said partition; and
    (d) means, located within the housing, for circulating the heat produced by said heating means, said means for circulating comprising a blower positioned beneath said partition, said blower circulating heat produced by said heating member through openings in said partition and about said fluorescent light tubes to heat said tubes to a temperature above ambient temperature.

2. An apparatus according to claim 1 further comprising dividers substantially longitudinally between the tubes.

3. An apparatus according to claim 1 wherein said blower is a suction blower.

4. An apparatus according to claim 1 wherein said means for producing heat is capable of heating said tubes to a temperature between 35° C. and 45° C.

5. An apparatus according to claim 1 wherein said means for producing heat is capable of heating said tubes to a temperature of about 40° C.

6. An apparatus according to claim 1 wherein said heating member is electrically heated.

7. An apparatus according to claim 1 wherein said heating member is heated by hot fluids.

8. An apparatus for exposing a photopolymerizable material comprising:
    (a) a housing;
    (b) at least one fluorescent light tube contained within said housing;
    (c) a means for producing heat located within the housing, said means for producing heat comprising a heat transmitting partition connected to upright members and a heating member positioned adjacent and underneath said partition; and
    (d) a means, located within the housing, for circulating the heat produced by said heating means.

9. An apparatus according to claim 8 wherein said means, located within the housing, for circulating the heat produced by said heating member, further comprises a blower positioned beneath said partition, said blower circulating heat produced by said heating member through openings in said partition and about said fluorescence at least one light tube to heat said tube to a temperature above ambient temperature.

10. An apparatus according to claim 9 wherein said blower is a suction blower.

11. An apparatus according to claim 8 wherein said heating member is heated by hot fluids.

12. An apparatus according to claim 8 wherein said heating member is electrically heated.

* * * * *